US006751132B2

(12) United States Patent
Jang et al.

(10) Patent No.: US 6,751,132 B2
(45) Date of Patent: Jun. 15, 2004

(54) SEMICONDUCTOR MEMORY DEVICE AND VOLTAGE GENERATING METHOD THEREOF

(75) Inventors: Hyun-Soon Jang, Seoul (KR); Jae-Hoon Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 37 days.

(21) Appl. No.: 10/108,240

(22) Filed: Mar. 26, 2002

(65) Prior Publication Data

US 2002/0141248 A1 Oct. 3, 2002

(30) Foreign Application Priority Data

Mar. 27, 2001 (KR) ........................................ 2001-16065

(51) Int. Cl.[7] .............................................. G11C 7/00
(52) U.S. Cl. .................... 365/189.09; 365/226
(58) Field of Search ...................... 365/189.09, 210, 365/189.07, 229, 226

(56) References Cited

U.S. PATENT DOCUMENTS

| 4,348,596 | A | * | 9/1982 | Atherton et al. ............. 365/210 |
| 5,687,114 | A | * | 11/1997 | Khan ..................... 365/185.03 |
| 6,172,917 | B1 | * | 1/2001 | Kataoka et al. ......... 365/189.05 |
| 6,498,469 | B2 | * | 12/2002 | Kobayashi .................. 323/313 |

* cited by examiner

*Primary Examiner*—Thong Q. Le
(74) *Attorney, Agent, or Firm*—F. Chau & Associates LLC

(57) ABSTRACT

A semiconductor memory device which provides an improved operation performance in response to a relatively low external power voltage is included. The device comprises a plurality of direct-current voltage generating circuits for generating a plurality of direct-current voltages and a plurality of reference voltage generating circuits for generating reference voltages for the plurality of the direct-current voltage generating circuits, respectively.

18 Claims, 6 Drawing Sheets

SEMICONDUCTOR MEMORY DEVICE AND VOLTAGE GENERATING METHOD THEREOF

CROSS-REFERENCE TO RELATED APPLICATION

This application claims priority to Korean Patent Application No. 2001-16065, filed on Mar. 27, 2001.

BACKGROUND

1. Technical Field

The present invention relates to a semiconductor memory device, and more particularly, to a semiconductor memory device that generates a high voltage using a reference voltage for a peripheral circuit and a voltage generating method thereof.

2. Description of Related Art

A conventional semiconductor memory device includes reference voltage generating circuits for a peripheral circuit and a memory cell array. In the conventional semiconductor memory device, the reference voltages for the peripheral circuit and the memory cell array are generated using a reference voltage that is generated in response to an external power voltage.

The reference voltage for the peripheral circuit is used for generating an internal power voltage for the peripheral circuit that is used in generating a high voltage and a substrate voltage. The reference voltage for the memory cell array is used for generating an internal power voltage, a substrate voltage and a bit line pre-charge voltage for the memory cell array. By using the two reference voltages for the peripheral circuit and the memory cell array, the conventional semiconductor memory device generates a plurality of direct-current voltages having a desired level therein. However, it is impossible to stably generate a plurality of the direct-current voltages having a desired level using the two reference voltages.

For example, a conventional semiconductor memory device generates a high voltage using an internal power voltage for a peripheral circuit but not an internal power voltage for a memory cell array. This is because the internal power voltage for the memory cell array is very noisy. Further, it is not easy to select a proper internal power voltage among a plurality of internal power voltages output from the memory cell array, because each bank in the memory cell array generates the internal power voltage to suppress a noise propagation using its internal power voltage generating circuit.

A conventional semiconductor memory device is designed to maintain a predetermined voltage difference between an internal power voltage for a memory cell array and a high voltage. If a voltage difference between the internal power voltage for the memory cell array and the high voltage is smaller than a desired voltage difference, a data transmission can be delayed when NMOS transistors transmit data having a logic "high" level.

However, since a conventional semiconductor memory device generates a high voltage using an internal power voltage for a peripheral circuit, a voltage difference between the internal power voltage for the peripheral circuit and the high voltage becomes smaller than a desired voltage difference, in response to a relatively low external power voltage. This is because the internal power voltage for the peripheral circuit is greater in level than the internal power voltage for the memory cell array. For example, when the relatively low external power voltage is applied to the device, the internal power voltage for the memory cell array reaches a desired level faster than the internal power voltage for the peripheral circuit. The voltage difference between the high voltage and the internal power voltage for the memory cell array is decreased. As a result, a high voltage having a relatively low level is generated, thereby deteriorating an operation performance.

SUMMARY OF THE INVENTION

It is an object of the present invention to provide a semiconductor memory device that can stably generate a plurality of direct-current voltages having a desired level.

It is another object of the present invention to provide a semiconductor memory device having an excellent operation performance.

According to one aspect of the present invention, a semiconductor memory device comprises a plurality of direct-current voltage generating circuits for generating a plurality of direct-current voltages, and a plurality of reference voltage generating circuits for generating reference voltages for the plurality of the direct-current voltage generating circuits.

According to another aspect of the present invention, a semiconductor memory device comprises a memory cell array, a peripheral circuit for controlling a data transmission operation for the memory cell array, a first reference voltage generating circuit for generating a first reference voltage for the memory cell array in response to an external power voltage, a second reference voltage generating circuit for generating a second reference voltage for the peripheral circuit in response to the external power voltage, the second reference voltage being greater than the first reference voltage, a third reference voltage generating circuit for generating a third reference voltage for a high voltage in response to the external power voltage, and a high voltage generating circuit for generating the high voltage in response to the third reference voltage.

According to another aspect of the present invention, a semiconductor memory device comprises a memory cell array, a peripheral circuit for controlling a data transmission operation for the memory cell array, a first reference voltage generating circuit for generating a first reference voltage for the memory cell array in response to an external power voltage, a second reference voltage generating circuit for generating a second reference voltage for the peripheral circuit in response to the external power voltage, the second reference voltage being greater than the first reference voltage, and a high voltage generating circuit for receiving an external third reference voltage to generate a high voltage.

According to another aspect of the present invention, a method is provied for generating a voltage in a semiconductor memory device comprising the steps of generating a plurality of reference voltages for a plurality of direct-current circuits, in response to an external power voltage, and generating a plurality of direct-current voltages by the direct-current circuits in response to the plurality of the reference voltages.

According to another aspect of the present invention, a method is provided for generating a voltage in a semiconductor memory device comprising the stesp of generating first to third reference voltages in response to an external power voltage, wherein the first reference voltage is used for the memory cell array, wherein the second reference voltage is used for the peripheral circuit and is greater than first reference voltage, and wherein the third reference voltage is used for a high voltage, and generating the high voltage in response to the third reference voltage.

According to further aspect of the present invention, a method is provided for generating a voltage in a semiconductor memory device comprising the stesp of generating first and second reference voltages in response to an external power, the first reference voltage being for the memory cell array, the second reference voltage being for the peripheral circuit and greater than first reference voltage, and generating a high voltage in response to an external third reference voltage.

These and other aspects, factores, and advantages of the prosent invention will become apparent from the following detailed description of preferred embodiments, wihich is to be read in conujction with the accompaning figures.

DETAILED DESCRIPTION OF PREFFERED EMBODIMENTS

Figure 1:
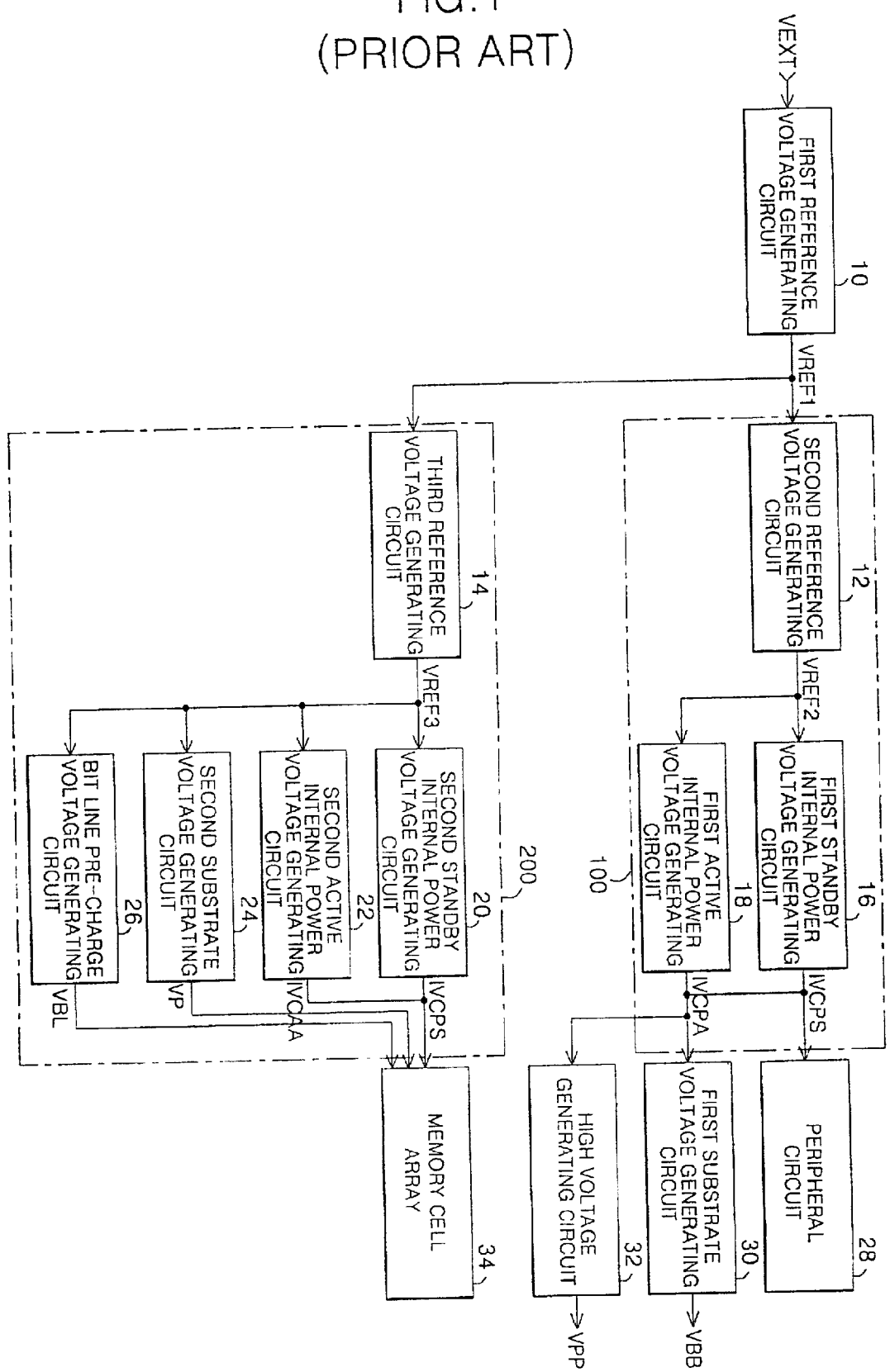
FIG. 1 is a block diagram illustrating a conventional semiconductor memory device.

FIG. 1 is a block diagram illustrating a conventional semiconductor memory device. The semiconductor memory device comprises a first reference voltage generating circuit 10, a voltage generating circuit 100 for a peripheral circuit 28, a voltage generating circuit 200 for a memory cell array 34, a first substrate voltage generating circuit 30, and a high voltage generating circuit 32.

The voltage generating circuit 100 comprises a second reference voltage generating circuit 12, a first standby internal power voltage generating circuit 16, and a first active internal power voltage generating circuit 18.

The voltage generating circuit 200 comprises a third reference voltage generating circuit 14, a second standby internal power voltage generating circuit 20, a second active internal power voltage generating circuit 22, a second substrate voltage generating circuit 24, and a bit line pre-charge voltage generating circuit 26.

The first reference voltage generating circuit 10 receives an external power voltage VEXT to generate a first reference voltage VREF1. The second reference voltage generating circuit 12 receives the first reference voltage VREF1 to generate a second reference voltage VREF2. The first standby internal power voltage generating circuit 16 receives the second reference voltage VREF2 to generate a standby internal power voltage IVCPS during a standby operation and an active operation. The first active internal power voltage generating circuit 18 receives the second reference voltage VREF2 to generate an active internal power voltage IVCPA for the peripheral circuit 28 during an active operation. The first substrate voltage generating circuit 30 receives the active internal power voltage IVCPA to generate a substrate voltage VBB for the peripheral circuit 28. The high voltage generating circuit 32 receives the active internal power voltage IVCPA to generate a high voltage VPP for both the peripheral circuit 28 and the memory cell array 34.

The third reference voltage generating circuit 14 receives the first reference voltage VREF1 to generate a third reference voltage VREF3. The second standby internal power voltage generating circuit 20 receives the third reference voltage VREF3 to generate a standby internal power voltage IVCPS for the memory cell array 34 during a standby operation and an active operation. The second active internal power voltage generating circuit 22 receives the third reference voltage VREF3 to generate an active internal power voltage IVCAA for the memory cell array 34 during an active operation. The second substrate voltage generating circuit 24 receives the third reference voltage VREF3 to generate a substrate voltage VP for the memory cell array 34. The bit line pre-charge generating circuit 26 receives the third reference voltage VREF3 to generate a bit line pre-charge voltage VBL.

The semiconductor memory device of FIG. 1 is designed such that the active internal power voltage IVCPA for the peripheral circuit 28 is greater than the active internal power voltage IVCAA for the memory cell array 34, and the second reference voltage VREF2 for the peripheral circuit 28 is greater than the third reference voltage VREF3 for the memory cell array 34. According to the design, a voltage difference between the high voltage VPP and the active internal power voltage IVCAA becomes constant.

However, when the active internal power voltage IVCAA for the memory cell array 34 is generated to a desired level in response to a relatively low external power voltage VEXT, the active internal power voltage IVCPA for the peripheral circuit 28 is not generated to a desired level. This is because the high voltage generating circuit 32 is configured to generate the high voltage VPP using the internal power voltage IVCPA for the peripheral circuit 28. Thus, a problem occurs in that a voltage difference between the high voltage VPP and the external power voltage VEXT is not constant, thereby deteriorating an operation performance of the semiconductor memory device.

Figure 2:
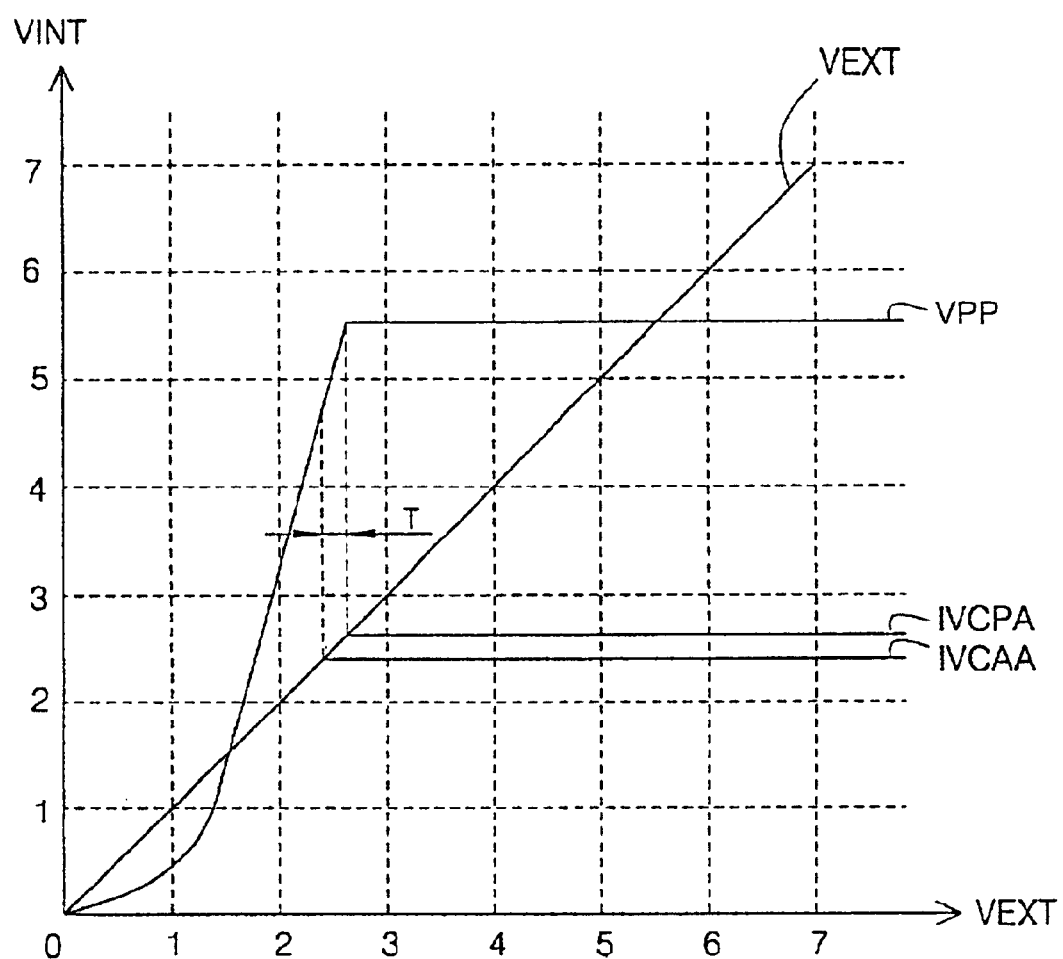
FIG. 2 is a graph illustrating variations of an internal power voltage and a high voltage according to a variation of an external power voltage of a conventional semiconductor memory device.

FIG. 2 is a graph illustrating variations of the internal power voltages IVCPA and IVCAA and the high voltage VPP according to a variation of the external power voltage VEXT of the conventional semiconductor memory device.

As a level of the external power voltage VEXT increases, levels of the active internal power voltages IVCPA and IVCAA also increase. However, since a level of the active internal power voltage IVCPA is greater than that of the active internal power voltage IVCAA, the active internal power voltage IVCAA reaches a desired level before the active internal power voltage IVCPA. That is, the active internal power voltage IVCPA is delayed as a time period "T" as the active internal power voltage IVCAA, and then reaches a desired level.

For example, in FIG. 2, the active internal power voltage IVCPA for the peripheral circuit is about 2.8 V, and the active internal power voltage IVCAA for the memory cell array is about 2.5 V. That is, as the external power voltage VEXT increases, the active internal power voltage IVCAA reaches a desired level by a time period "T" ahead of the active internal power voltage IVCPA.

However, the high voltage VPP is generated using the active internal power voltage IVCPA for the peripheral circuit. Therefore, when the high voltage VPP is generated in the state that the active internal power voltage IVCPA does not reach a desired level yet, it is impossible that a voltage difference between the high voltage VPP and the active internal power voltage WVCAA for the memory cell array remains constant. As a result, an operation performance of the semiconductor memory device deteriorates.

Figure 3:
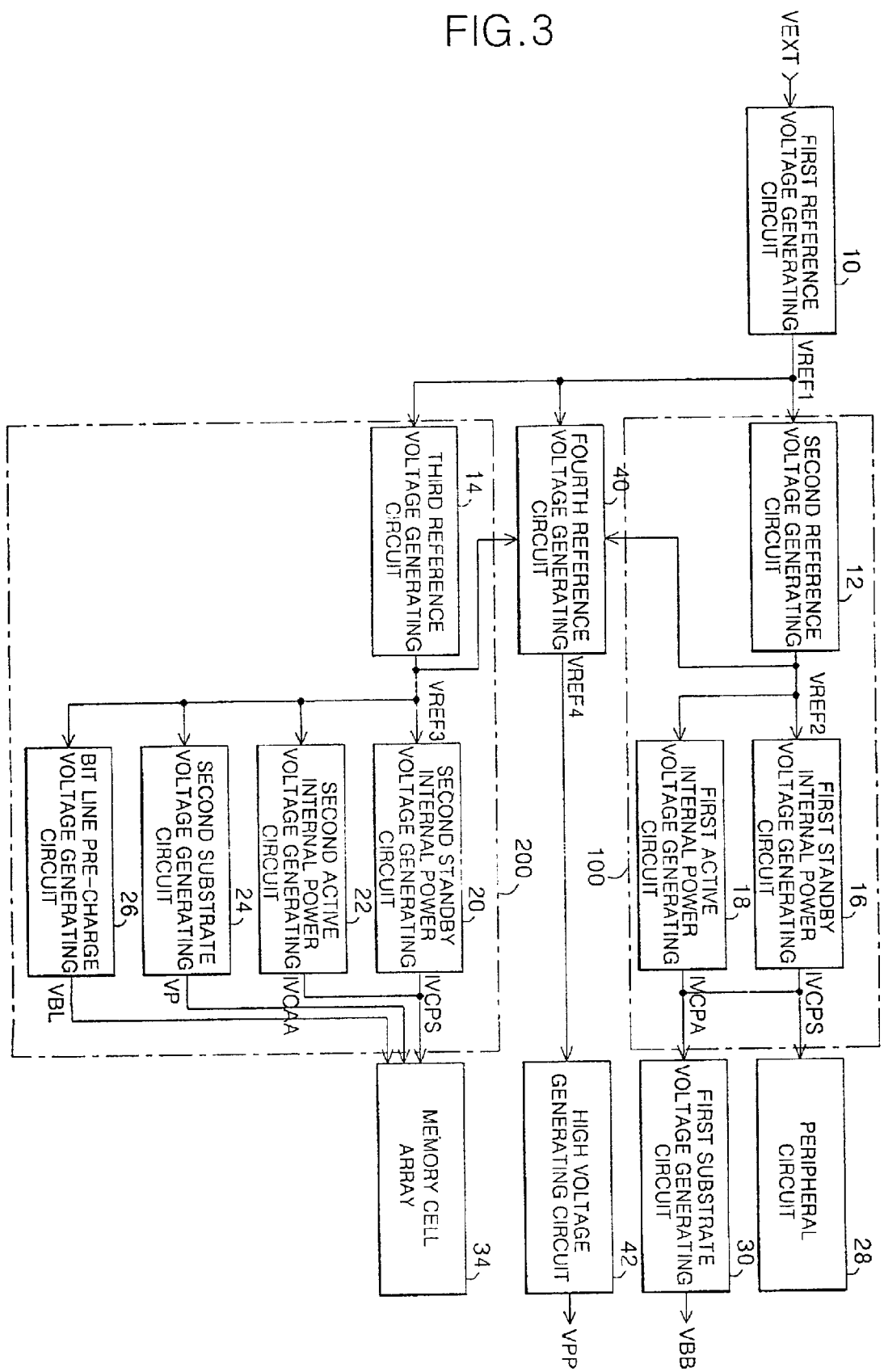
FIG. 3 is a block diagram illustrating a semiconductor memory device according to one embodiment of the present invention.

Referring now to FIG. 3, a semiconductor memory device according to an embodiment of the present invention comprises a first reference voltage generating circuit 10, a fourth reference voltage generating circuit 40, a high voltage generating circuit 42, a voltage generating circuit 100 for a peripheral circuit 28, and a voltage generating circuit 200 for a memory cell array 34. The semiconductor memory device comprises the fourth reference voltage generating circuit 40 and the high voltage generating circuit 42 instead of the high voltage generating circuit 32 of the device of FIG. 1. In FIGS. 1 and 3, like reference numerals denote elements having the same or similar ftunctions The fourth reference voltage generating circuit 40 receives a first reference voltage VREF1 to generate a fourth reference voltage VREF4. The high voltage generating circuit 42 receives the fourth reference voltage VREF4 to generate a high voltage VPP. Since the high voltage generating circuit 42 of FIG. 3 generates the high voltage VPP using the fourth reference voltage VREF4, a voltage difference between the high voltage VPP and an active internal power voltage IVCAA remains constant even at a relatively low external power voltage VEXT. Thus, there is no deterioration of an operation performance in the semiconductor memory device of FIG. 3 due to decreasing of the voltage difference between the high voltage VPP and the active internal power voltage IVCAA.

The high voltage generating circuit 42 of FIG. 3 generates the high voltage VPP using the first reference voltage VREF1, while the high voltage generating circuit 32 of FIG. 1 generates the high voltage VPP using the second reference voltage VREF2.

In particular, the fourth reference voltage generating circuit 40 does not generate the fourth reference voltage VREF4 until the internal power voltage IVCAA for the memory cell array reaches a desired level. That is, when the internal power voltage IVCAA reaches a desired level, the forth reference voltage generating circuit 40 generates the fourth reference voltage VREF4 using the first reference voltage VREF1. The high voltage generating circuit 42 generates the high voltage VPP using the fourth reference voltage VREF4, that is, when the internal power voltage IVCAA for the memory cell array reaches a desired level. Thus, a voltage difference between the high voltage VPP and the internal power voltage IVCAA for the memory cell array can remain constant in response to a relatively low external power voltage VEXT.

Even though not shown, a semiconductor memory device according to another embodiment of the present invention may be configured to generate the high voltage VPP using a fourth reference voltage VREF4 that is generated not internally but externally. That is, a semiconductor memory device may comprise a separate pin for receiving a fourth reference voltage VREF4 from an outside.

Figure 4:
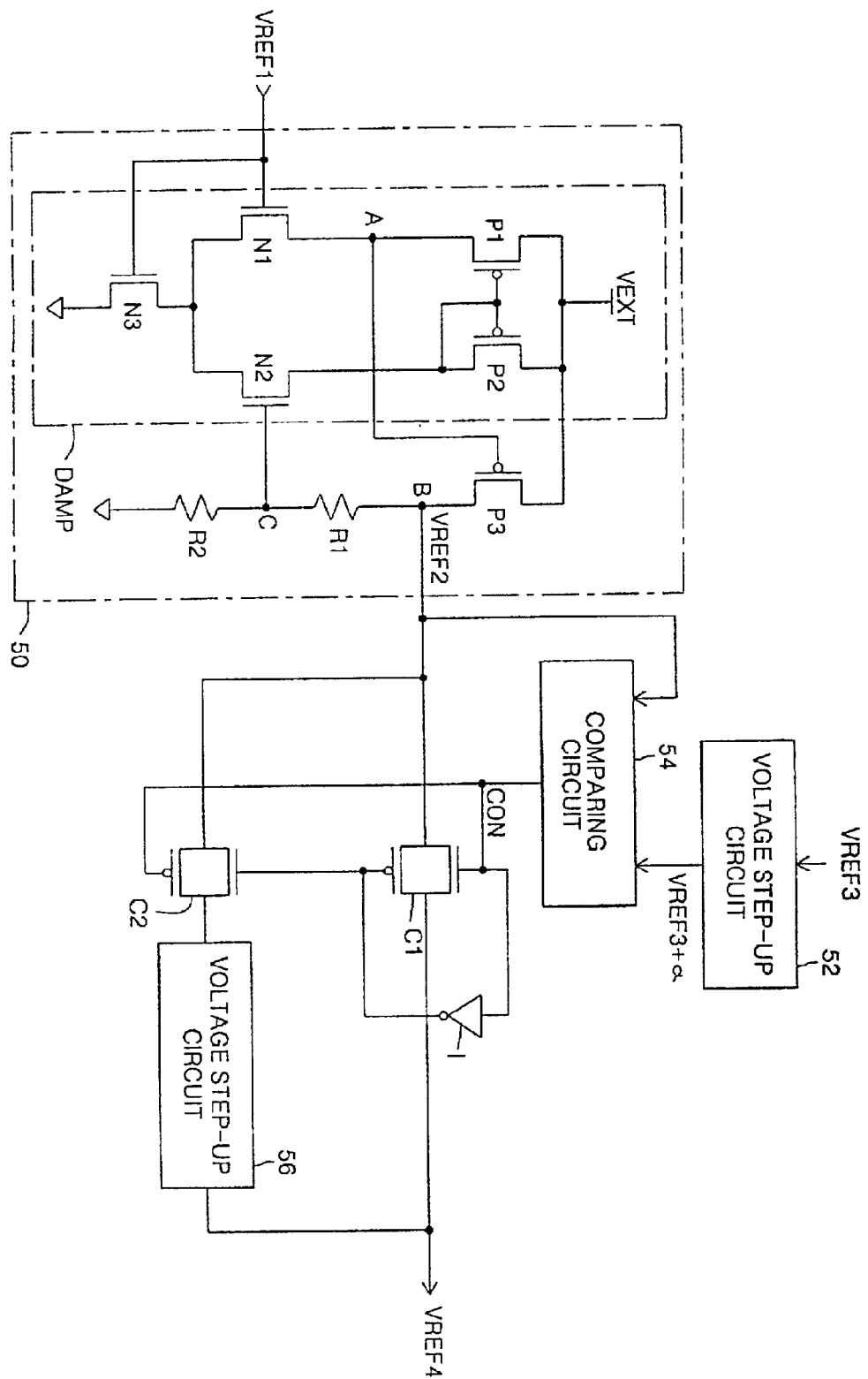
FIG. 4 is a circuit diagram illustrating a fourth reference voltage generating circuit of FIG. 3.

FIG. 4 is a circuit diagram illustrating the fourth reference voltage generating circuit 40 of FIG. 3.

The fourth reference voltage generating circuit 40 comprises a reference voltage generating circuit 50, voltage step-up circuits 52 and 56, a comparing circuit 54, CMOS transmission gates C1 and C2, and an inverter I. The reference voltage generating circuit 50 comprises a PMOS transistor P3, resistors R1 and R2, and a differential amplifier DAMP comprising PMOS transistors P1 and P2, and NMOS transistors N1 to N3.

The reference voltage generating circuit 50 controls a level of the second reference voltage VREF2 in response to the first reference voltage VREF1 to generate the second reference voltage VREF2 having a constant level. For instance, the reference voltage generate circuit 50 lowers a level of the second reference voltage VREF2 when the level of the second reference voltage VREF2 is higher than a desired level, and increases the level of the second reference voltage VREF2 when the level of the second reference voltage VREF2 is lower than the desired level.

In particular, the differential amplifier DAMP compares the first reference voltage VREF1 with a voltage of a node C. The different amplifier DAMP lowers a voltage of a node A when a level of the first reference voltage VREF1 is greater than a level of the voltage of the node C, and increases a voltage of the node A when a level of the first reference voltage VREF1 is lower than a level of the voltage of the node C. The PMOS transistor P3 controls a level of the second reference voltage VREF2 based on a change of the voltage of the node A. When the voltage of the node A is increased, the PMOS transistor P3 lowers a level of the second reference voltage VREF2. When the voltage of the node A is decreased, the transistor P3 increases a level of the second reference voltage VREF2. The resistors R1 and R2 divide the second reference voltage VREF2 to output a divided voltage to the node C.

The voltage step-up circuit 52 boosts the third reference voltage VREF3 by a α-voltage to generate a voltage "VREF3+α". The comparing circuit 54 compares the controlled second reference voltage VREF2 with the voltage "VREF3+α" to generate a control signal (CON). The comparing circuit 54 generates the control signal (CON) having a logic "high" level when the controlled second reference voltage VREF2 is identical to the voltage "VREF3+α", and generates the control signal (CON) having a logic "low" level when the two voltages are different from each other. The CMOS transmission gate C1 is turned on in response to the control signal (CON) having a logic "high" level to generate the second reference voltage VREF2 as the fourth reference voltage VREF4. The CMOS transmission gate C2 is turned on in response to the control signal (CON) having a logic "low" level to transmit the second reference voltage VREF2 to the voltage step-up circuit 56. The voltage step-up circuit 56 boosts a level of the second reference voltage VREF2 transmitted from the CMOS transmission gate C2 by an α-voltage to generate the boosted second reference voltage VREF2 as the fourth reference voltage VREF4.

That is, the fourth reference voltage generating circuit 40 generates the forth reference voltage VREF4 using the first, second and third reference voltages VREF2, VREF2, and VREF3. The forth reference voltage generating circuit 40 controls a level of the second reference voltage VREF2 in response to a level of the first reference voltage VREF1, and generates the controlled second reference voltage VREF2 as the fourth reference voltage VREF4 in response to the voltage "VREF3+α". For instance, if a level of the second reference voltage VREF2 is a voltage "VREF3+α", the second reference voltage VREF2 is output as the forth reference voltage VREF4. If a level of the second reference voltage VREF2 is not the voltage "VREF3+α" 40, the second reference voltage VREF2 is boosted by an α-voltage and the boosted second reference voltage VREF2 is output as the forth reference voltage VREF4.

Figure 5:
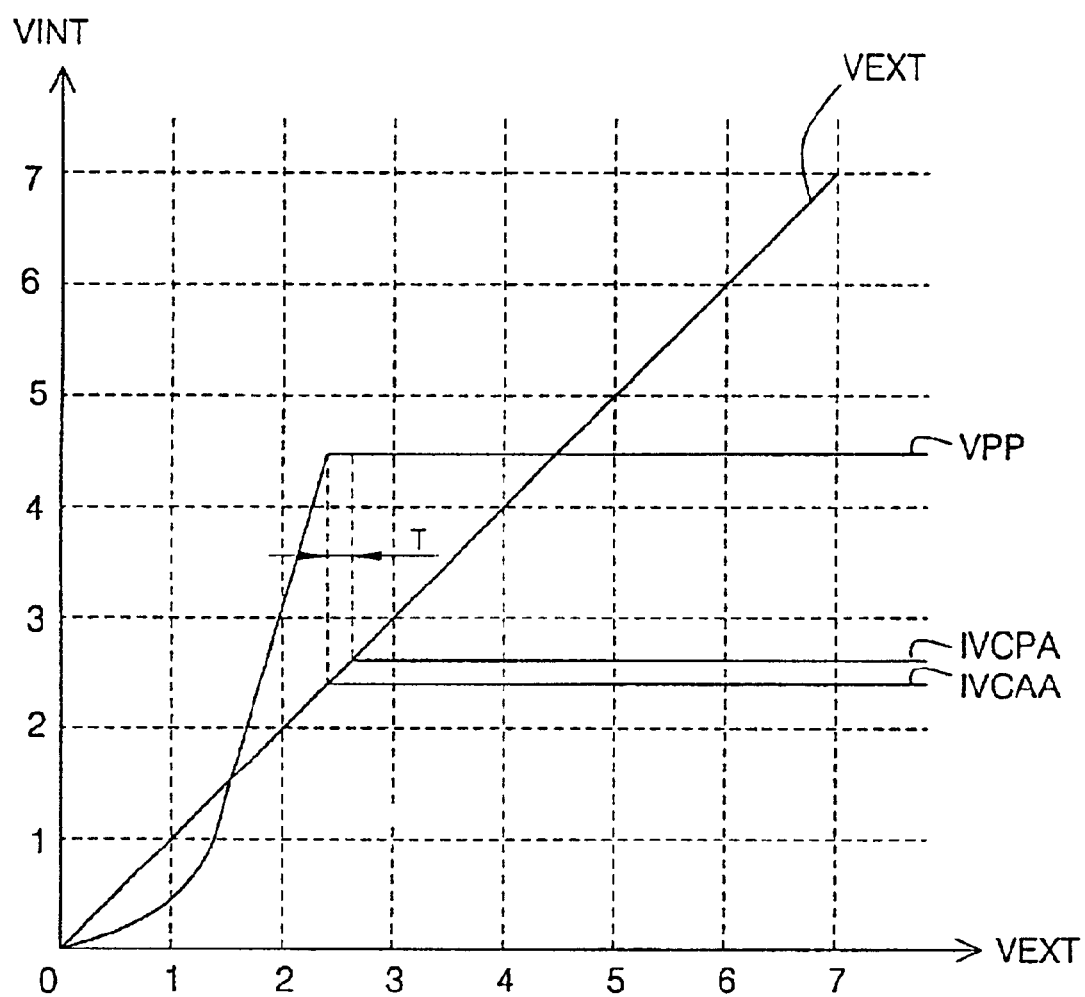
FIG. 5 is a graph illustrating variations of an internal power voltage and a high voltage according to a variation of an external power voltage of a semiconductor memory device according to the present invention.

FIG. 5 is a graph illustrating variations of the internal power voltages IVCPA and IVCAA and the high voltage VPP according to a variation of the external power voltage VEXT of a semiconductor memory device according to the present invention.

Unlike to a conventional semiconductor memory device as shown in FIG. 2, a semiconductor memory device according to the present invention maintains a constant voltage difference between the active internal power voltage IVCAA and the high voltage VPP within a time period "T". The high voltage VPP reaches a desired level when the active internal power voltage IVCAA reaches a desired level. Accordingly, a voltage difference between the active internal power voltage IVCAA and the high voltage VPP always remains constant.

Figure 6:
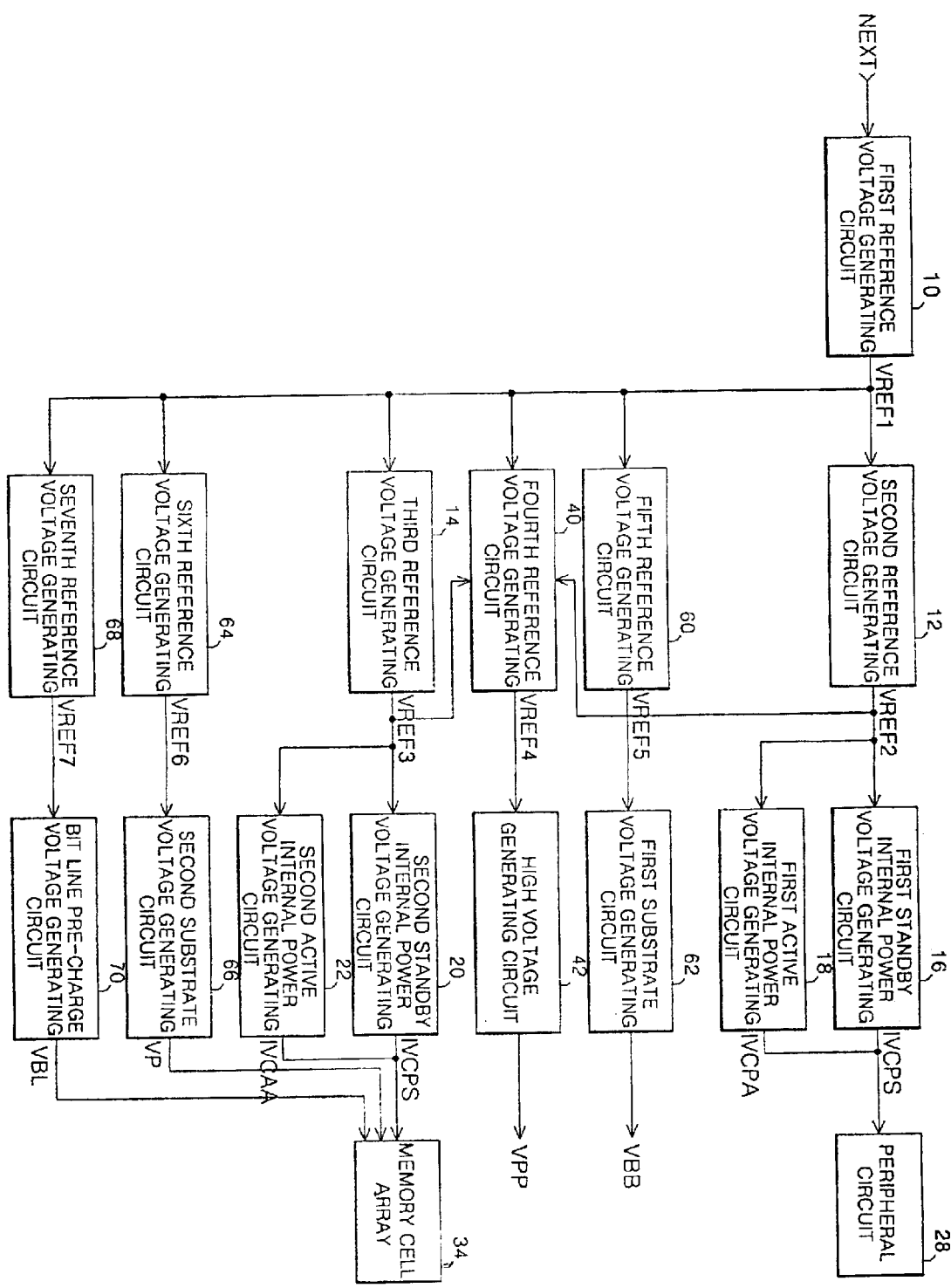
FIG. 6 is a block diagram illustrating a semiconductor memory device according to another embodiment of the present invention.

FIG. 6 is a block diagram illustrating a semiconductor memory device according to another embodiment of the present invention.

The semiconductor memory device of FIG. 6 comprises a fifth reference voltage generating circuit 60 and a first substrate voltage generating circuit 62 instead of the first substrate voltage generating circuit 30 of FIG. 3, a sixth reference voltage generating circuit 64 and a second substrate voltage generating circuit 66 instead of the second substrate voltage generating circuit 24 of FIG. 3, and a seventh reference voltage generating circuit 68 and a bit line pre-charge voltage generating circuit 70 instead of the bit line pre-charge voltage generating circuit 26 of FIG. 3.

The reference voltage generating circuits 60, 40, 64 and 68 are provided for the first substrate voltage generating circuit 62, the high voltage generating circuit 42, the second substrate voltage generating circuit 66, and the bit line pre-charge voltage generating circuit 70, respectively. Accordingly, the first substrate voltage generating circuit 62, the high voltage generating circuit 42, the second substrate voltage generating circuit 66, and the bit line pre-charge voltage generating circuit 70 can stably generate direct-current voltages VBB, VPP, VP, VBL, respectively.

Meanwhile, even though not shown, a semiconductor memory device according to another embodiment of the present invention may be configured such that the first substrate voltage VBB, the second substrate voltage VP, the high voltage VPP, and the bit line pre-charge voltage VBL are generated not internally but externally. For example, a semiconductor memory device may have separate pins for receiving the reference voltages VREF5, VREF6, VREF4, and VREF7 from an outside.

Advantageously, a semiconductor memory device according to the present invention improves an operation performance by separately applying reference voltages to a plurality of direct-current voltage generating circuit to generate a plurality of direct-current voltages having a desired level. Further, the semiconductor memory device has an improved operation performance since a voltage difference between a high voltage and a reference voltage for a memory cell array is constant even at a relatively low external power voltage.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor memory device, comprising:
   a plurality of direct-current voltage generating circuits for generating a plurality of direct-current voltages; and
   a plurality of reference voltage generating circuits for generating reference voltages for the plurality of the direct-current voltage generating circuits,
   wherein at least one of the reference voltage generating circuits receives as input reference voltages output from at least two other reference voltage generating circuits and generates a reference voltage based on said received reference voltages.

2. A semiconductor memory device, comprising:
   a memory cell array;
   a peripheral circuit for controlling a data transmission operation for the memory cell array;
   a first reference voltage generating circuit for generating a first reference voltage for the memory cell array in response to an external power voltage;
   a second reference voltage generating circuit for generating a second reference voltage for the peripheral circuit in response to the external power voltage, the second reference voltage being greater than the first reference voltage;
   a third reference voltage generating circuit for generating a third reference voltage for a high voltage in response to the external power voltage, wherein the third reference voltage generating circuit generates the third reference voltage based on the first and second reference voltages output from the first and second reference voltage generating circuits; and
   a high voltage generating circuit for generating the high voltage in response to the third reference voltage.

3. The device of claim 2, wherein a predetermined voltage difference between the third reference voltage and the first reference voltage is maintained.

4. The device of claim 2, wherein the first reference voltage is used to generate an internal power voltage for the memory cell array.

5. The device of claim 4, wherein the third reference voltage generating circuit generates the third reference voltage when the internal power voltage reaches a desired level.

6. The device of claim 4, wherein a predetermined voltage between the high voltage and the internal power voltage is maintained.

7. The device of claim 2, wherein the third reference voltage generating circuit comprises:
   a first voltage step-up circuit for boosting the first reference voltage by a predetermined voltage;
   a comparing circuit for comparing the second reference voltage with the boosted voltage output from the first voltage step-up circuit, and for generating a first control signal when the second reference voltage is identical to the boosted voltage; and
   a second voltage step-up circuit for generating the second reference voltage as the third reference voltage in response to the first control signal, and for boosting the second reference voltage by the predetermined voltage to generate the boosted second reference voltage as the third reference voltage when the second reference voltage is different from the boosted voltage.

8. The device of claim 7, wherein the comparing circuit generates a second control signal when the second reference voltage is different from the boosted voltage.

9. The device of claim 7, wherein the third reference voltage generating circuit further comprises a differential amplifier circuit for comparing the external power voltage with the second reference voltage and for controlling a level of the second reference voltage to have a desired level according to the comparison result.

10. A semiconductor memory device, comprising:

a memory cell array;

a peripheral circuit for controlling a data transmission operation for the memory cell array;

a first reference voltage generating circuit for generating a first reference voltage for the memory cell array in response to an external power voltage, wherein the first reference voltage is used to generate an internal power voltage for the memory cell array;

a second reference voltage generating circuit for generating a second reference voltage for the peripheral circuit in response to the external power voltage, the second reference voltage being greater than the first reference voltage; and a high voltage generating circuit for receiving an external third reference voltage to generate a high voltage having a first constant level, wherein said high voltage is generated only when said internal power voltage reaches a second constant level.

11. A method for generating a voltage in a semiconductor memory device, comprising the steps of:

generating a plurality of reference voltages for a plurality of direct-current circuits, in response to an external power voltage; and generating a plurality of direct-current voltages by the direct-current circuits in response to the plurality of the reference voltages, wherein the step of generating a plurality of reference voltages comprises receiving as input by a first reference voltage generating circuit, reference voltages output from at least two other reference voltage generating circuits, and generating a reference voltage based on said received reference voltages.

12. A method for generating a voltage in a semiconductor memory device comprising a memory cell array and a peripheral circuit, the peripheral circuit controlling a data transmission operation for the memory cell array, the method comprising the steps of:

generating first to third reference voltages in response to an external power voltage, wherein the first reference voltage is used for the memory cell array, wherein the second reference voltage is used for the peripheral circuit and is greater than first reference voltage, and wherein the third reference voltage is used for a high voltage, wherein the third reference voltage is generated based on the first and second reference voltages; and generating the high voltage in response to the third reference voltage.

13. The method of claim 12, wherein the first reference voltage is used to generate an internal power voltage for the memory cell array.

14. The method of claim 13, wherein the high voltage is generated when the internal power voltage reaches at a desired level.

15. The method of claim 12, wherein the step of generating a high voltage comprises the step of maintaining a predetermined voltage difference between the first reference voltage and the third reference voltage.

16. The method of claim 12, wherein the step of generating first to third reference voltages comprises the steps of:

boosting the first reference voltage by a predetermined voltage;

comparing the boosted first reference voltage with the second reference voltage; and generating the second reference voltage as the third reference voltage when the boosted first reference voltage is identical to the second reference voltage; and boosting the second reference voltage by the predetermined voltage to generate a boosted second reference voltage as the third reference voltage when the boosted first reference voltage is different from the second reference voltage.

17. The method of claim 16, further comprising the steps of:

comparing the external power voltage with the second reference voltage; and controlling a level of the second reference voltage to have a desired level according to the comparison result.

18. A method for generating a voltage in a semiconductor memory device comprising a memory cell array and a peripheral circuit, the peripheral circuit controlling a data transmission operation for the memory cell array, the method comprising the steps of:

generating first and second reference voltages in response to an external power, the first reference voltage being for the memory cell array, the second reference voltage being for the peripheral circuit and greater than first reference voltage, wherein the first reference voltage is used to generate an internal power voltage for the memory cell array; and generating a high voltage having a first constant level in response to an external third reference voltage, wherein said high voltage is generated only when said internal power voltage reaches a second constant level.

* * * * *